United States Patent
Ting et al.

(10) Patent No.: US 11,901,490 B2
(45) Date of Patent: Feb. 13, 2024

(54) PROTECTION LAYER AND METHOD FOR MAKING THE SAME

(71) Applicant: YUAN LICENSING CO., LTD., Taipei (TW)

(72) Inventors: Chao-Cheng Ting, Hsinchu (TW); Hao-Chung Kuo, Hsinchu (TW)

(73) Assignee: YUAN LICENSING CO., LTD., Taipei (TW)

( * ) Notice: Subject to any disclaimer, the term of this patent is extended or adjusted under 35 U.S.C. 154(b) by 639 days.

(21) Appl. No.: 16/932,829

(22) Filed: Jul. 20, 2020

(65) Prior Publication Data

US 2021/0028331 A1    Jan. 28, 2021

(30) Foreign Application Priority Data

Jul. 26, 2019 (TW) .................. 108126540

(51) Int. Cl.
*H01L 33/44* (2010.01)
*H01L 33/00* (2010.01)

(52) U.S. Cl.
CPC .......... *H01L 33/44* (2013.01); *H01L 33/0095* (2013.01); *H01L 2933/0025* (2013.01)

(58) Field of Classification Search
CPC ................. H01L 33/44; H01L 33/0095; H01L 2933/0025; H01S 5/0282; H01S 5/423; H01S 2301/176
See application file for complete search history.

(56) References Cited

U.S. PATENT DOCUMENTS 11,009,629 B2 * 5/2021 Maruyama ............ H01L 33/486
2008/0230779 A1 * 9/2008 Goyal ............... H01L 31/03928
257/E21.133

* cited by examiner

*Primary Examiner* — Su C Kim
(74) *Attorney, Agent, or Firm* — Amin, Turocy & Watson, LLP

(57) ABSTRACT

A protection layer for use in fabrication of failure analysis (FA) sample is disclosed, which principally comprises a first thin film, a buffer thin film and a second thin film By forming the protection layer on a surface of a malfunction device die, a FA sample of the malfunction device die is obtained. As a result, in the case of treating the sample with a FIB thinning process, there are no cracks, distortion, and/or collapse resulted from inter-elemental isobaric interferences, stress effect or charge accumulation occurring on the surface layer of the malfunction device die because of the protection of the protection layer. On the other hand, this protection layer can also be applied to a microLED element or a VCSEL element, so as to make microLED element and the VCSEL element possess excellent stress withstanding capability.

8 Claims, 3 Drawing Sheets

PROTECTION LAYER AND METHOD FOR MAKING THE SAME

BACKGROUND OF THE INVENTION

1. Field of the Invention

The present invention relates to the technology field of failure analysis (FA), and more particularly to a method for making a protection layer having various applications, including fabrication of FA sample, enhancement of yield of mass transfer process of microLED dies, being a surface passivation layer of a vertical cavity surface emitting laser (VCSEL).

2. Description of the Prior Art

With the rapid development of science and technology, especially in integrated circuit (IC) chips, technologies of semiconductor process are continuously improved so as to have a significant progress. However, because there is a need to make the gate width of MOSFET device be shorten for achieving a high performance of the IC chip, IC foundries have made great efforts in enhancement of yield of semiconductor process of integrated circuit fabrication.

Failure analysis (FA) is known an important way for assisting in enhancement of yield of semiconductor process. There are a variety of failure modes found in semiconductor devices and/or IC chips that are manufactured by the semiconductor process. Practical experiences have indicated that, each of the failure modes certainly caused by a corresponding semiconductor process error. Nowadays, Failure analysis (FA) methods are included electrical failure analysis (EFA) and physical failure analysis (PFA). When a semiconductor device or an IC chip is in failure or malfunction, EFA is the first for being applied to the semiconductor device or the IC chip, and PFA is subsequently applied to the semiconductor device or the IC chip based on analysis data of the EFA. Consequently, at least one failure source causing the malfunction of the semiconductor device (or the IC chip) can be found out based on analysis data of the PFA. It is worth explaining that, high resolution scientific instruments such as field-emission scanning electron microscope (FE-SEM), focused ion beam (FIB) system and transmission electron microscope (TEM) play important roles in failure analysis of the devices and/or the IC chips that are fabricated by semiconductor process.

Transmission electron microscope (TEM) is known having a good resolution of 0.2 nm. However, owing to the limited penetration depth of electron beams, sample of a specific device that needing to be applied with a failure analysis is required to receive a thinning treatment so as to have a controlled thickness of 50-100 nm. Therefore, PFA engineers commonly apply the thinning process to a malfunction device, so as to process the malfunction device to be a sample that is suitable for using the TEM to complete the failure analysis. There are two device thinning ways being as follows.

In a first of the two device thinning methods, a chemical etching solution and an abrasive cloth are adopted for applying a surface layer removing process to the malfunction device. However, due to the fact that each of various malfunction devices has a specific surface layer thickness thereof, it fails to avoid material layers under the surface layer from being damaged by the abrasive cloth and/or the chemical etching solution due to over etching or over polishing. As a result, despite the malfunction device having received the surface layer removing treatment is process to a sample, the sample is still not suitable for using the TEM to complete the failure analysis.

In a second of the two device thinning methods, a grinding and polishing process is firstly applied to the malfunction device, and then the malfunction device is arranged to receive a thinning process by using a FIB instrument. It is worth noting that, the surface of the malfunction device would be coated with a Pt passivation layer before using FIB instrument to execute the thinning process. The Pt passivation layer is an electrically conductive layer for use in cancellation of charge accumulation that occurs near the surface layer of the malfunction device during the thinning process. Practical experiences have indicated that, mass interference is found occurring between the Pt passivation layer and the surface layer of the malfunction device, and may lead the surface layer to have cracks or be broken during the thinning process. Especially, in case of the surface layer is a polymer layer like photoresistor, the surface layer would be peeled off from the malfunction device as using the using FIB instrument to execute the thinning process, thereby resulting in the unsuccess of the sample manufacture of the malfunction device.

From above descriptions, it is clear that there is a room for improvement in the conventional way for making a sample of a specific malfunction device. Accordingly, inventors of the present application have made great efforts to make inventive research and eventually provided a protection layer and a method for making the same.

SUMMARY OF THE INVENTION

The primary objective of the present invention is to disclose a protection layer and method for making the same, wherein the protection layer is for use in fabrication of failure analysis (FA) sample, and principally comprises a first thin film, a buffer thin film and a second thin film By forming the protection layer on a surface of a malfunction device die, a FA sample of the malfunction device die is obtained. As a result, in the case of treating the sample with a FIB thinning process, there are no cracks, distortion and/or collapse resulted from inter-elemental isobaric interferences, stress effect or charge accumulation occurring on the surface layer of the malfunction device die because of the protection of the protection layer. On the other hand, this protection layer can also be applied to a microLED element or a VCSEL element or other high energy photon emission devices, so as to make microLED element and the VCSEL, and LED element possess excellent stress withstanding capability.

In order to achieve the primary objective of the present invention, inventors of the present invention provides an embodiment for the protection layer, comprising:
  a first thin film made of a first material;
  a second thin film made of a second material, being formed on the first thin film; and
  a buffer thin film, being formed between the first thin film and the second thin film;
  wherein both the first material and the second material are selected from the group of metal oxide, metal sulfide, metal selenide, metal nitride, and metal oxynitride, and the buffer thin film being made of a mixture or a compound of the first material and the second material.

For achieving the primary objective of the present invention, inventors of the present invention also provides an embodiment for the protection layer manufacturing method, comprising:

(1) forming a first thin film on a surface of a sample by using a first material as a raw material;
(2) forming a buffer thin film on the first thin film; and
(3) forming a second thin film on the buffer thin film by using a second material as a raw material;
wherein both the first material and the second material are selected from the group of metal oxide, metal sulfide, metal selenide, metal nitride, and metal oxynitride, and the buffer thin film being made of a mixture or a compound of the first material and the second material.

In a practicable embodiment, the sample can be applied with a thinning process before the first thin film is formed on the surface of the sample.

In a practicable embodiment, the metal oxide, the metal sulfide, the metal selenide, the metal nitride, and the metal oxynitride all include at least one metal composition, the metal composition system is selected from the group consisting of mono-metal composition, bimetal composition, and poly-metal composition.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a protection layer and a method for making the same that are disclosed by the present invention, embodiments of the present invention will be described in detail with reference to the attached drawings hereinafter.

Figure 1:
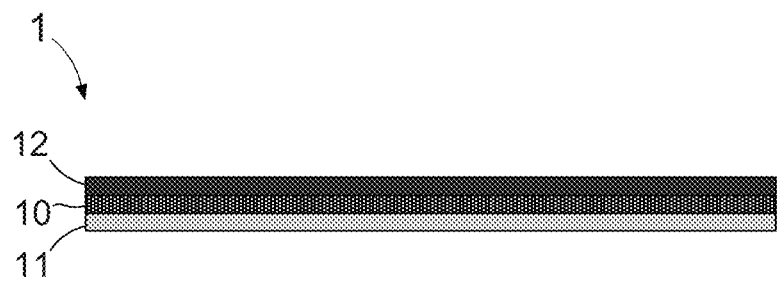
FIG. 1 shows a side cross-sectional view of a protection layer according to the present invention.
Figure 2:
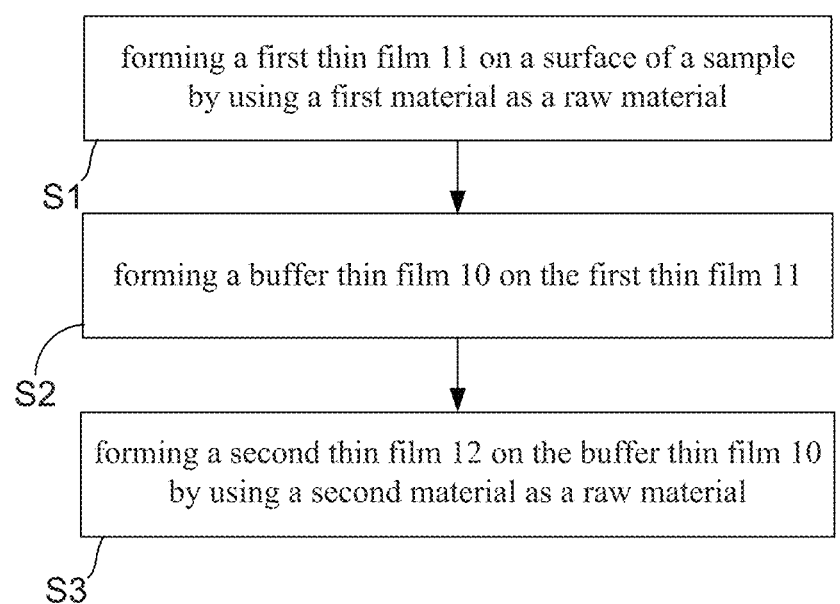
FIG. 2 shows a flowchart diagram of a protection layer manufacturing method according to the present invention.
Figure 3:
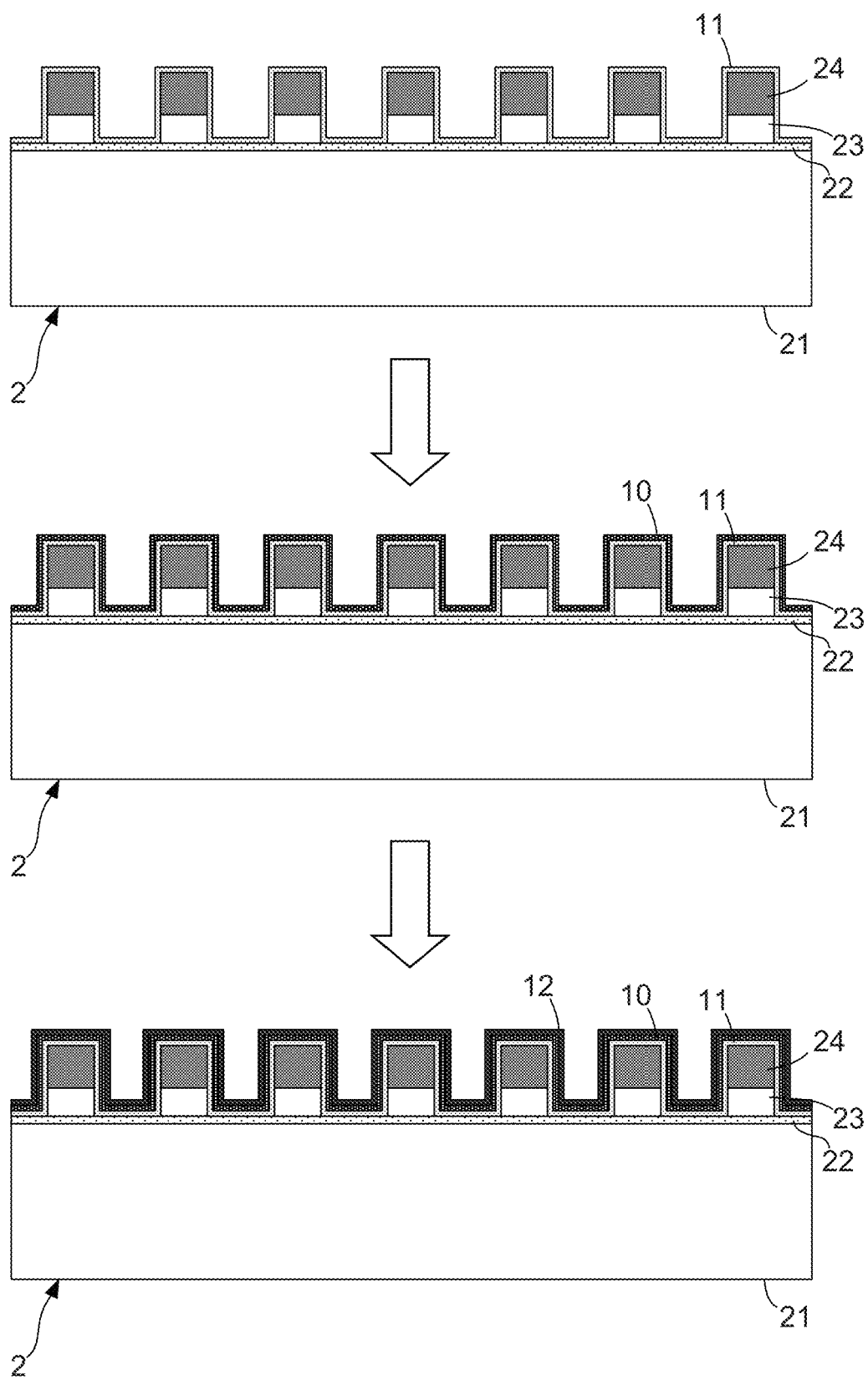
FIG. 3 shows a diagram for describing schematic manufacturing processes of the protection layer.

With reference to FIG. 1, there is shown a side cross-sectional view of a protection layer according to the present invention. Moreover, FIG. 2 shows a flowchart diagram of a protection layer manufacturing method according to the present invention, and FIG. 3 shows a diagram for describing schematic manufacturing processes of the protection layer. The present invention discloses a protection layer that has various applications, including fabrication of failure analysis (FA) sample, enhancement of yield of mass transfer process of microLED dies, and being a surface passivation layer of a vertical cavity surface emitting laser (VCSEL). When being applied in fabrication of FA sample, a malfunction device die 2 such as a semiconductor device die or an IC device die includes a substrate 21, wherein an isolation layer 22 like a SiO2 film or a specific film having high dielectric constant is formed on the substrate 21. In addition, there are a plurality of active layers 23 formed on the isolation layer 22, for example, gate electrode of semiconductor field-effect transistor (MOSFET) or emission layer of light-emitting diode (LED). It is worth explaining that, patterned photoresist layer is needed to be formed on the active layers 23 through photolithography process, so as to subsequently make each of the active layers 23 has a well-controlled width through etching process. Herein, the forgoing photoresist layer can be regarded as a top layer 24, and process error(s) occurring in the etching process and/or the photolithography process are known the principal cause for leading the width of the active layer 23 be too narrow or over wide.

Physical failure analysis (PFA) is widely used in inspection and analysis of the causes that bring on the process error(s) during the etching process and/or the photolithography process. As FIG. 1, FIG. 2 and FIG. 3 show, when manufacturing a protection layer 1 on the top layer 24, the manufacturing method is firstly proceeded to step S1, so as to form a first thin film 11 on a surface of a sample (i.e., malfunction device die 2) by using a first material as a raw material. It should be understood that, the forgoing surface of the sample 2 is the top layer 24. Herein, it needs to particularly emphasize that, the malfunction device die 2 depicted in FIG. 3 is adopted for assisting in descriptions of the manufacturing processes of the protection layer 1, and is not used for limiting the practicable application of the protection layer 1 of the present invention. For example, when the protection layer 1 is applied in enhancement of yield of mass transfer process of microLED dies, the sample 2 is a microLED die or a microLED array consisting of M×N microLED dies. On the other hand, when the protection layer 1 is used for being a surface passivation layer of a vertical cavity surface emitting laser (VCSEL), the sample 2 is the VCSEL.

Subsequently, the manufacturing method is proceeded to step S2 for forming a buffer thin film 10 on the first thin film 11. Consequently, the manufacturing method is proceeded to step S3, so as to form a second thin film 12 on the buffer thin film 10 by using a second material as a raw material. In the present invention, both the first material and the second material are selected from the group of metal oxide, metal sulfide, metal selenide, metal nitride, and metal oxynitride, and the buffer thin film is made of a mixture or a compound of the first material and the second material. Moreover, it is worth further explaining that, the metal oxide, the metal sulfide, the metal selenide, the metal nitride, and the metal oxynitride all include at least one metal composition, the metal composition system is selected from the group consisting of mono-metal composition, bimetal composition, and poly-metal composition.

In the present invention, moreover, a first metal element for constituting the first material has a first atom radius, and a second metal element for constituting the second material also has a second atom radius, wherein the second atom radius is greater than the first atom radius. Examples of the first material and the second material are listed in following Table (2).

TABLE 2

| First material for making the first thin film 11 | Second material for making the second thin film 12 |
| --- | --- |
| $WS_2$ (atom radius of W is 135 pm) | $MoS_2$ (atom radius of Mo is 145 pm) |
| $WSe_2$ (atom radius of W is 135 pm) | |
| $Al_2O_3$ (atom radius of Al is 118 pm) | $PtO_2$ (atom radius of Pt is 135 pm) $TiO_2$ (atom radius of Ti is 140 pm) $HfO2$ (atom radius of Hf is 155 pm) |
| $PtO_2$ | $TiO_2$ |

TABLE 2-continued

| First material for making the first thin film 11 | Second material for making the second thin film 12 |
|---|---|
| (atom radius of Pt is 135 pm) TiO2 (atom radius of Ti is 140 pm) AlN (atom radius of Al is 118 pm) | (atom radius of Ti is 140 pm) HfO2 (atom radius of Hf is 155 pm) MoN (atom radius of Mo is 145 pm) |

There are various materials listed in the Table (1), bust the materials are not used for being limited raw materials for the first material and the second material. On the other hand, the buffer thin film 10 is a binder layer formed between the first thin film 11 and the second thin film 12. In the present invention, the buffer thin film 10 is a made of a mixture of the first material and the second material, or is made of a compound of the first material and the second material. For example, $Al_2O_3/PtO_2$, $PtO_2/TiO_2$ and $TiO_2/HfO_2$.

Owing to the limited penetration depth of electron beams, sample 2 of the malfunction device die that needing to be applied with a failure analysis is required to receive a thinning treatment so as to have a controlled thickness less than 0.1 µm. Therefore, after the step S3 is completed, the sample 2 can be continuously transferred into a focused ion beam (FIB) system, so as to apply a FIB thinning process to the sample 2. However, for shortening the process time of the FIB thinning process, the sample 2 can be applied with a thinning process through by using a proper device thinning way before the first thin film 11 is formed on the surface of the sample 2.

Figure 4:
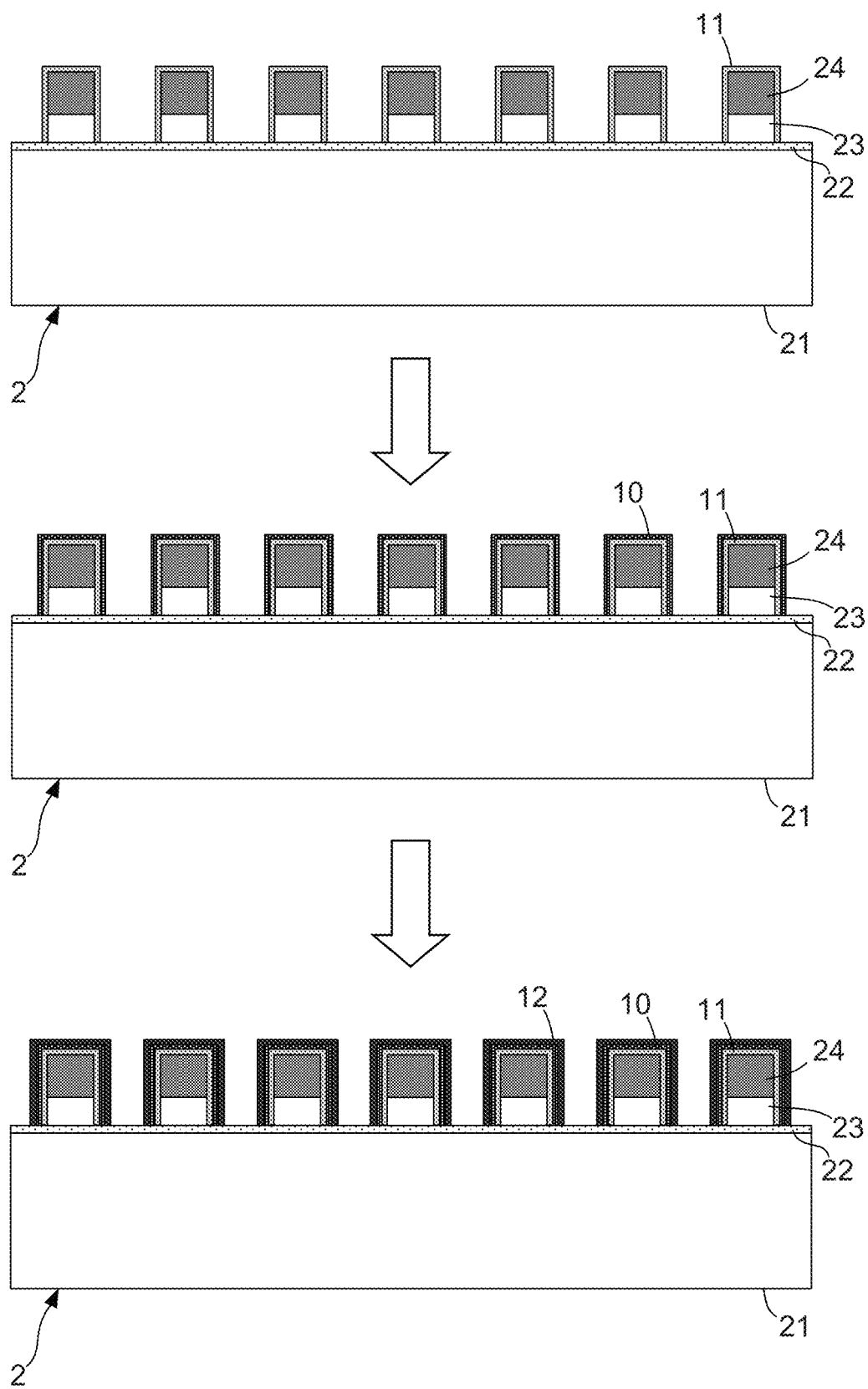
FIG. 4 shows a diagram for describing schematic manufacturing processes of the protection layer that is applied in fabrication of failure analysis (FA) sample.

FIG. 4 shows a diagram for describing schematic manufacturing processes of the protection layer that is applied in fabrication of failure analysis (FA) sample. From FIG. 4, it is found that the protection layer 1 constituted by a first thin film 11, a buffer thin film 10 and a second thin film 12 partially covers the surface of the sample 2. Especially, the protection layer 1 is arranged to only cover the active layer 23 and the photoresistor layer 24 of the malfunction device die (sample 2).

Therefore, through above descriptions, all embodiments and their constituting elements of the protection layer proposed by the present invention have been introduced completely and clearly; in summary, the present invention includes the advantages of:

(1) The present invention discloses a protection layer 1 and method for making the same, wherein the protection layer 1 is for use in fabrication of failure analysis (FA) sample, and principally comprises a first thin film 11, a buffer thin film 10 and a second thin film 12. By forming the protection layer 1 on a surface of a malfunction device die 2, a FA sample of the malfunction device die 2 is obtained. As a result, in the case of treating the sample with a FIB thinning process, there are no cracks, distortion and/or collapse resulted from inter-elemental isobaric interferences, stress effect or charge accumulation occurring on the surface layer of the malfunction device die 2 because of the protection of the protection layer 1. On the other hand, this protection layer 1 can also be applied to a microLED element or a VCSEL element, so as to make microLED element and the VCSEL element possess excellent stress withstanding capability.

The above description is made on embodiments of the present invention. However, the embodiments are not intended to limit scope of the present invention, and all equivalent implementations or alterations within the spirit of the present invention still fall within the scope of the present invention.

What is claimed is:

1. A protection layer, comprising:
   a first thin film made of a first material;
   a second thin film made of a second material, being formed on the first thin film; and
   a buffer thin film, being formed between the first thin film and the second thin film;
   wherein both the first material and the second material are selected from the group of metal oxide, metal sulfide, metal selenide, metal nitride, and metal oxynitride, and the buffer thin film being made of a mixture or a compound of the first material and the second material;
   wherein a first metal element for constituting the first material has a first atom radius, and a second metal element for constituting the second material having a second atom radius that is greater than the first atom radius.

2. The protection layer of claim 1, wherein the protection layer has an application that is selected from the group consisting of fabrication of failure analysis (FA) sample, enhancement of yield of mass transfer process of microLED dies, and being a surface passivation layer of a vertical cavity surface emitting laser (VCSEL).

3. A protection layer manufacturing method, comprising:
   (1) forming a first thin film on a surface of a sample by using a first material as a raw material;
   (2) forming a buffer thin film on the first thin film; and
   (3) forming a second thin film on the buffer thin film by using a second material as a raw material;
   wherein both the first material and the second material are selected from the group of metal oxide, metal sulfide, metal selenide, metal nitride, and metal oxynitride, and the buffer thin film being made of a mixture or a compound of the first material and the second material;
   wherein a first metal element for constituting the first material has a first atom radius, and a second metal element for constituting the second material having a second atom radius that is greater than the first atom radius.

4. The protection layer manufacturing method of claim 3, wherein the sample is applied with a thinning process before the first thin film is formed on the surface of the sample.

5. The protection layer manufacturing method of claim 3, further comprising:
   (4) transferring the sample into a focused ion beam (FIB) system, so as to apply a FIB thinning process to the sample.

6. The protection layer manufacturing method of claim 3, wherein the first thin film partially or completely covers the surface of the sample.

7. The protection layer manufacturing method of claim 3, wherein the sample includes an active layer that is covered by the first thin film.

8. The protection layer manufacturing method of claim 3, wherein the metal oxide, the metal sulfide, the metal selenide, the metal nitride, and the metal oxynitride all include at least one metal composition, the metal composition system is selected from the group consisting of mono-metal composition, bimetal composition, and poly-metal composition.

* * * * *